United States Patent
Foster (10) Patent No.: US 6,627,977 B1
(45) Date of Patent: Sep. 30, 2003

(54) SEMICONDUCTOR PACKAGE INCLUDING ISOLATED RING STRUCTURE

(75) Inventor: Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/142,222

(22) Filed: May 9, 2002

(51) Int. Cl.[7] .............................................. H01L 23/495
(52) U.S. Cl. ....................................... 257/666; 257/676
(58) Field of Search ................................ 257/666, 676, 257/691; 438/123

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 4,907,067 A | 3/1990 | Derryberry |
| 5,041,902 A | 8/1991 | McShane |
| 5,087,961 A | 2/1992 | Long et al. |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,332,864 A | 7/1994 | Liang et al. |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |
| JP | 59208756 | 11/1984 |
| JP | 59227143 | 12/1984 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 6092076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

*Primary Examiner*—Sheila V. Clark
(74) *Attorney, Agent, or Firm*—Stetina Brunda Garred & Brucker (57) ABSTRACT

A semiconductor package includes a chip mounting pad having a peripheral edge. The package further includes a semiconductor chip attached to the chip mounting pad. The package further includes a plurality of leads which each have an inner end disposed adjacent the peripheral edge in spaced relation thereto and an opposing distal end. The package includes at least one isolated ring structure electrically connected to the semiconductor chip and at least one of the leads. The ring structure includes a main body portion disposed along the peripheral edge between the peripheral edge and the inner ends of the leads in spaced relation thereto, and at least one stub portion extending angularly from the main body portion along one of the leads in spaced relation thereto.

32 Claims, 5 Drawing Sheets

U.S. PATENT DOCUMENTS

| | | |
|---|---|---|
| 5,336,931 A | 8/1994 | Juskey et al. |
| 5,343,076 A | 8/1994 | Katayama et al. |
| 5,406,124 A | 4/1995 | Morita et al. |
| 5,424,576 A | 6/1995 | Djennas et al. |
| 5,428,248 A | 6/1995 | Cha |
| 5,435,057 A | 7/1995 | Bindra et al. |
| 5,474,958 A | 12/1995 | Djennas et al. |
| 5,521,429 A | 5/1996 | Aono et al. |
| 5,545,923 A * | 8/1996 | Barber |
| 5,581,122 A | 12/1996 | Chao et al. |
| 5,604,376 A | 2/1997 | Hamburgen et al. |
| 5,608,267 A | 3/1997 | Mahulikar et al. |
| 5,625,222 A | 4/1997 | Yoneda et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasaranthi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,776,798 A | 7/1998 | Quan et al. |
| 5,783,861 A | 7/1998 | Son |
| 5,801,440 A * | 9/1998 | Chu et al. |
| 5,814,877 A * | 9/1998 | Diffenderfer et al. |
| 5,835,988 A | 11/1998 | Ishii |
| 5,859,471 A | 1/1999 | Kuraishi et al. |
| 5,866,939 A | 2/1999 | Shin et al. |
| 5,877,043 A | 3/1999 | Alcoe et al. |
| 5,894,108 A | 4/1999 | Mostafazadeh et al. |
| 5,903,050 A * | 5/1999 | Thurairajaratnam et al. |
| 5,942,794 A | 8/1999 | Okumura et al. |
| 5,959,356 A | 9/1999 | Oh |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,025,640 A | 2/2000 | Yagi et al. |
| 6,034,423 A | 3/2000 | Mostafazadeh et al. |
| 6,072,228 A | 6/2000 | Hinkle et al. |
| 6,130,115 A | 10/2000 | Okumura et al. |
| 6,130,473 A | 10/2000 | Mostafazadeh et al. |
| 6,133,623 A * | 10/2000 | Otsuki et al. |
| 6,140,154 A | 10/2000 | Hinkle et al. |
| 6,143,981 A | 11/2000 | Glenn |
| 6,198,171 B1 | 3/2001 | Huang et al. |
| 6,225,146 B1 | 5/2001 | Yamaguchi et al. |
| 6,229,200 B1 | 5/2001 | Mclellan et al. |
| 6,242,281 B1 | 6/2001 | Mclellan et al. |
| 6,281,568 B1 | 8/2001 | Glenn et al. |
| 6,294,100 B1 | 9/2001 | Fan et al. |
| 6,380,048 B1 * | 4/2002 | Boon et al. |

* cited by examiner

SEMICONDUCTOR PACKAGE INCLUDING ISOLATED RING STRUCTURE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a lead frame semiconductor package which includes an isolated ring structure to provide common power/ground connections similar to those provided by laminate area array packages.

2. Description of the Related Art

As is well known in the electrical arts, integrated circuit dies or chips are conventionally enclosed in plastic packages that provide protection from hostile environments and enable electrical interconnection between the integrated circuit die and a substrate such as a printed circuit board or PCB. The elements of the package typically include a metal lead frame, an integrated circuit die, a bonding material used to attach the integrated circuit die to the lead frame, bond wires which electrically connect pads on the integrated circuit die to respective, individual leads or contacts of the lead frame, and a hard plastic encapsulant material which covers the other components and forms the predominant portion of the exterior of the package.

In the chip package, the lead frame is the central supporting structure thereof. A conventional lead frame includes a die pad for accommodating the integrated circuit die, and a plurality of leads or contacts. In many varieties of integrated circuit chip packages, each bond pad provided on the die is wire-bonded to a respective contact, with portions of the contacts or leads protruding from or being exposed within the plastic encapsulant or package body and used to mount or electrically connect the chip package to the printed circuit board. In addition to portions of the leads or contacts being exposed, in certain chip packages, one surface of the die pad is also exposed for purposes of providing a thermally conductive path to dissipate heat from the integrated circuit die which is attached to the opposed surface of the die pad and is internal to the package, i.e., surrounded by the plastic encapsulant.

An overall limitation of the semiconductor chip design as well as the semiconductor package has been the electrical connections and configurations utilized to satisfy the required electrical inputs and outputs to and from the input/output pads. Accordingly, there is a need in the art for improved semiconductor package designs for improved efficiency of the electrical connections and configurations utilized to satisfy the required electrical inputs and outputs to and from the input/output pads.

BRIEF SUMMARY OF THE INVENTION

In accordance with an aspect of the present invention, there is provided a semiconductor package which includes a chip mounting pad having a peripheral edge. The package further includes a semiconductor chip attached to the chip mounting pad. The package further includes a plurality of leads which each have an inner end disposed adjacent the peripheral edge in spaced relation thereto and an opposing distal end. The package includes at least one isolated ring structure electrically connected to the semiconductor chip and at least one of the leads. The ring structure includes a main body portion disposed along the peripheral edge between the peripheral edge and the inner ends of the leads in spaced relation thereto, and at least one stub portion extending angularly from the main body portion and along one of the leads in spaced relation thereto.

Advantageously, the isolated ring structure may be utilized as generic electrical power or ground source for the semiconductor chip. For example, where the semiconductor chip includes multiple input/output pads requiring connection to a common electrical potential, such input/output pads may simply be commonly connected to the ring structure which in turn is connected to a single lead dedicated to attachment to the required power or ground source. This maximizes the number of leads available for various input and output functions of the semiconductor package. In addition, the stub portion of each ring structure is advantageously utilized for maintaining the ring structure in fixed relationship to the chip mounting pad and the leads during fabrication of the semiconductor package. Thus, the stub portion allows for enhanced mechanically stabilization of the internal components of the semiconductor package during fabrication.

The present invention is best understood by reference to the following detailed description when read in conjunction with the accompanying drawings.

BRIEF DESCRIPTION OF THE DRAWINGS

These, as well as other features of the present invention, will become more apparent upon reference to the accompanying drawings wherein.

Common reference numerals are used throughout the drawings and detailed description to indicate like elements.

DETAILED DESCRIPTION OF THE INVENTION

Referring now to the drawings wherein the showings are for purposes of illustrating preferred embodiments of the present invention only, and not for purposes of limiting the same, FIGS. 1–8 illustrate semiconductor packages and methods of fabricating the same according to aspects of the present invention.

Lead frames for semiconductor packages are typically manufactured by mechanically stamping or chemically etching a continuous metal strip. The lead frame serves as a lead connecting a semiconductor chip to an external circuit such as a printed circuit board. The lead frame further serves as a frame for fixing the semiconductor package to the printed circuit board while providing an electrical connection between the printed circuit board and the semiconductor chip.

Figure 1:
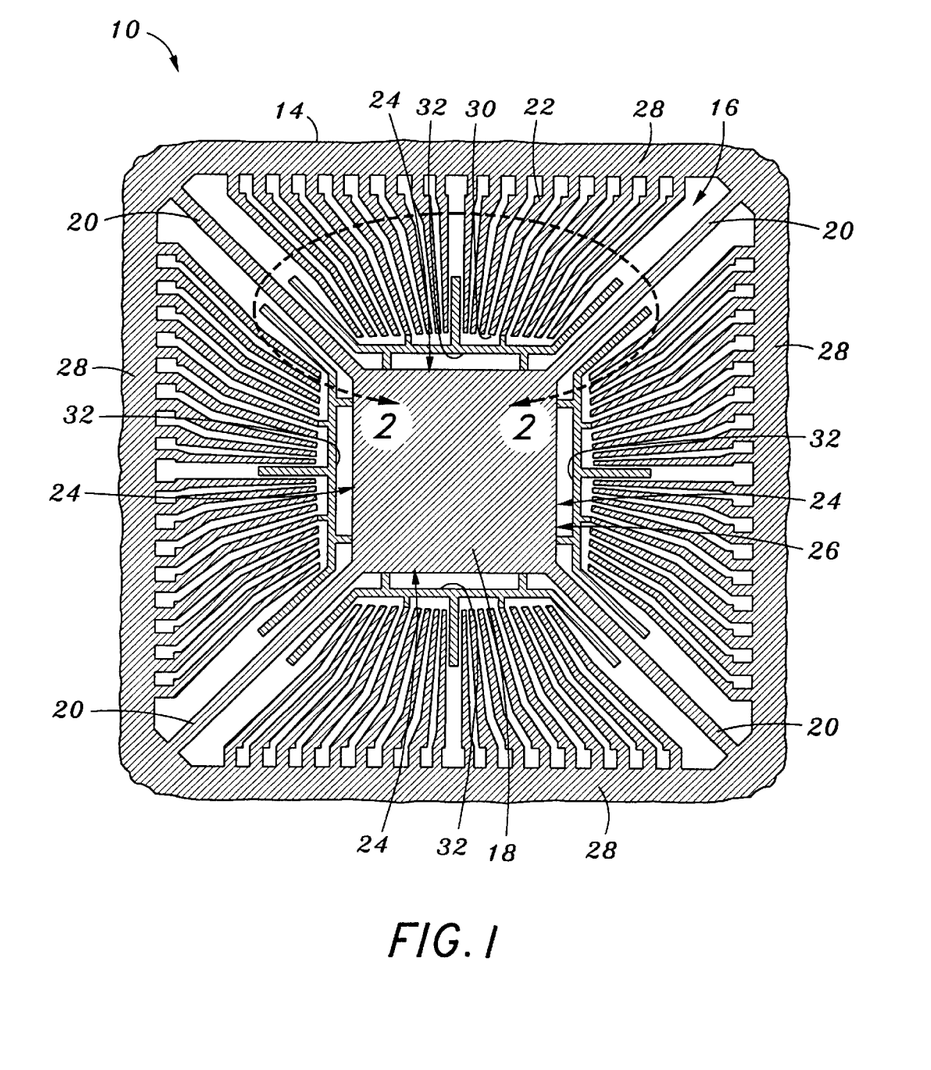
FIG. 1 is a top plan view of a lead frame including a chip mounting pad, ring structures and leads of a semiconductor package constructed in accordance with an aspect of the present invention.
Figure 6:
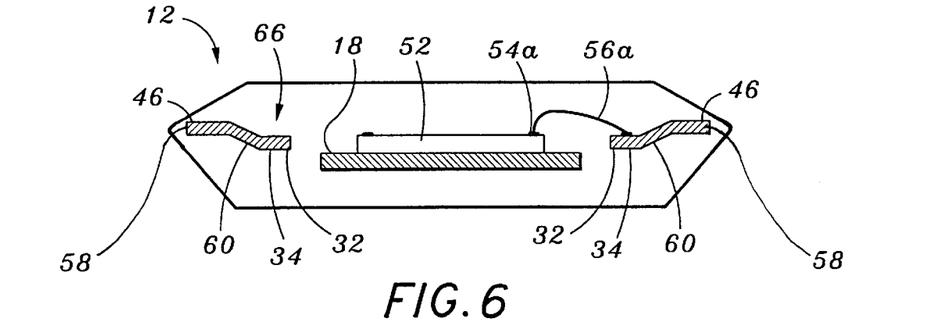
FIG. 6 is a cross sectional view of a completed semiconductor package as seen along axis 6—6 of FIG. 4.

According to an aspect of the present invention, a lead frame 10 is initially provided in a method of fabricating a semiconductor package 12 (as shown in FIG. 6). FIG. 1 is a top plan view of the lead frame 10. The lead frame 10 includes a frame 14 which is a substantially flat or planar plate defining a centrally located space 16. Disposed within the space 16 is a chip mounting pad 18 of the lead frame 10. The chip mounting pad 18 is a substantially square plate which is connected to the frame 14 by a plurality of tie bars 20. Four (4) tie bars 20 are used to connect the chip mounting pad 18 to the frame 14, with the tie bars 20 extending from respective ones of the four corner regions defined by the chip mounting pad 18. The tie bars 20 facilitate the stable support of the chip mounting pad 18 inside of the frame 14, and more particularly within the space 16 defined thereby.

The lead frame 10 further includes a plurality of leads 22 which extend from the frame 14 into the space 16 toward the chip mounting pad 18. A total of seventy-two leads 22 are included in the lead frame 10, with the leads 22 being segregated into four sets of eighteen, and each set of eighteen being disposed in spaced relation to a respective one of the four peripheral edge segments 24 of a peripheral edge 26 defined by the chip mounting pad 18. The leads 22 are each connected to and extend angularly from dambars 28. A total of four dambars 28 are shown in lead frame 10, with each set of eighteen leads 22 extending from a respective dambar 28 and terminating at an inner end 30. Thus, the leads 22 are supported in a stable manner in the space 16 defined by the frame 14 by the dambars 28.

Those of ordinary skill in the art will recognize that the number, position and path of the leads 22 may be varied, and that the leads 22 can be suitably designed according to the number and position of input/output paths desired in the semiconductor package 12. Additionally, though the lead frame 10 is shown as a square configuration, it may alternatively be rectangularly configured. Similarly, though the chip mounting pad 18 is shown as being generally square, the same may also be provided in a generally rectangular configuration. Further, though the leads 22 are shown as being formed in four separate sets around the peripheral edge 26 of the chip mounting pad 18, the leads 22 may also be provided in only two sets extending along and in spaced relation to respective ones of only two of the peripheral edge segments 24 of the chip mounting pad 18. Still further, the chip mounting pad 18 may be connected to the frame 14 through the use of only two tie bars 20 as opposed to the four tie bars 20 as shown.

The lead frame 10 further includes at least one isolated ring structure 32. In the embodiment shown, four ring structures 32 are disposed along respective ones of the four peripheral edge segments 24 of the chip mounting pad 18 between the peripheral edge 26 and the inner ends 30 of the leads 22 in spaced relation thereto. In this regard, the ring structures 32 collectively form a "ring" about the chip mounting pad 18.

Figure 2:
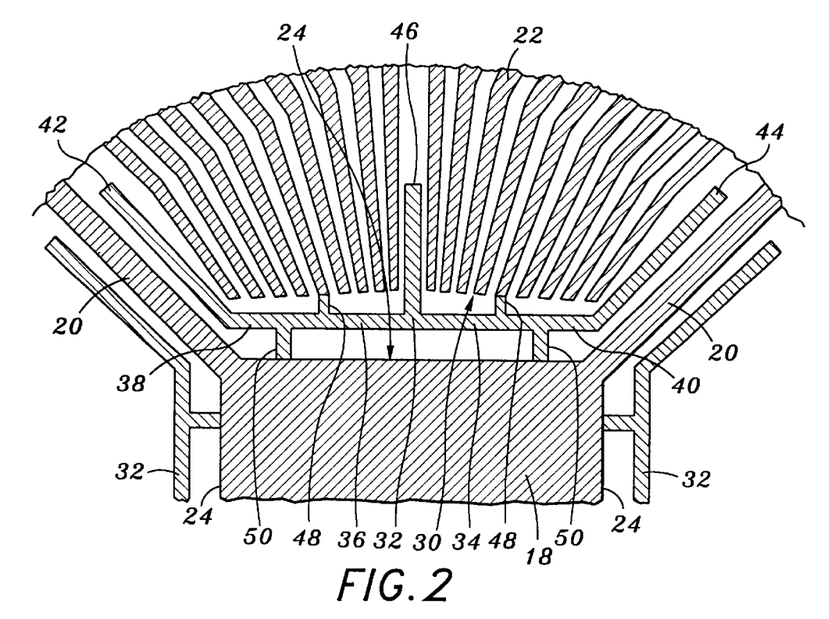
FIG. 2 is an enlargement of the encircled region of the lead frame as shown in FIG. 1.

Referring additionally to FIG. 2 there is depicted an enlargement of the encircled region of the lead frame 10 as shown in FIG. 1. Each ring structure 32 includes a main body portion 34 which is disposed along a respective peripheral edge segment 24. The main body portion 34 includes an intermediate section 36 which is bounded by opposing end sections 38, 40. The main body portion 34 is disposed between the inner ends 30 of the leads 22 and the peripheral edge segments 24. With the exception of temporary connecting bars 48 described below, the main body portion 34 is disposed in spaced relation to the inner ends 30 of the leads 22 and the peripheral edge segments 24.

Each ring structure 32 further includes at least one stub portion, such as first, second and third stub portions 42, 44, 46. Additional or fewer stub portions may be included. The first and second stub portions 42, 44 extend outwardly from respective ones of the end sections 38, 40. The first and second stub portions 42, 44 may angularly extend from the main body portion 34. Each of the first and second stub portions 42, 44 extend between a given tie bar 20 and an adjoining lead 22. The third stub portion 46 extends laterally from the intermediate section 36 away from the peripheral edge segment 24 along and between a pair of the leads 22.

Two pairs of temporary connecting bars 48, 50 are utilized to support the ring structure 32 within the frame 14 and to maintain the ring structure 32 in fixed relation to the chip mounting pad 18 and the leads 22 during fabrication of the lead frame 10. In the embodiment shown, two temporary connecting bars 48 extend between selected ones of the leads 22 (specifically leads 22a) and the intermediate section 36, and two temporary connecting bars 50 extend between the intermediate section 36 and the adjacent peripheral edge segment 24.

It is contemplated that additional or fewer temporary connecting bars 48, 50 may be utilized to connect the ring structure 32 to the frame 14. For example, though not shown, connecting bars 48 may extend from any one of the stub portions 42, 44, 46. Thus, the ring structure 32 need not be directly connected to the chip mounting pad 18 and the leads 22, but may none the less be connected via connecting bars to other structures of the frame 14. Further, the temporary connecting bars 48, 50 are not required to connect to the chip mounting pad 18 or the leads 22 as shown, but may be attached to other structures connected to the frame 14, such as the tie bars 20 or the dambars 28. While the ring structures 32 and temporary connecting bars 48, 50 are shown to have a different hatch patterns from that of the chip mounting pad 18, the tie bars 20, and the leads 22 it is understood that such structures are formed from a contiguous sheet of material of the lead frame 10, as the such different hatch patterns are only utilized for ease of identification.

The lead frame 10 may be manufactured from a sheet of metal material, such as copper (Cu), copper alloy (Cu Alloy), alloy 37 (nickel (Ni) of 37%, iron (Fe) of 55%). Moreover, it is contemplated that the lead frame 10 need not have a uniform thickness. For example, selective portions of such components, such as a portions or each lead 22 or peripheral portion of the chip mounting pad 18 may be undercut via etching for improved encapsulant adhesion during later stages of the fabrication of the semiconductor package 12.

Finally, the lead frame 10 may be plated with a conductive metal, such as gold (Au), silver (Ag), nickel (Ni), palladium (Pd), or alloys thereof, as a surface preparation to facilitate bonding as discussed below.

Figure 3:
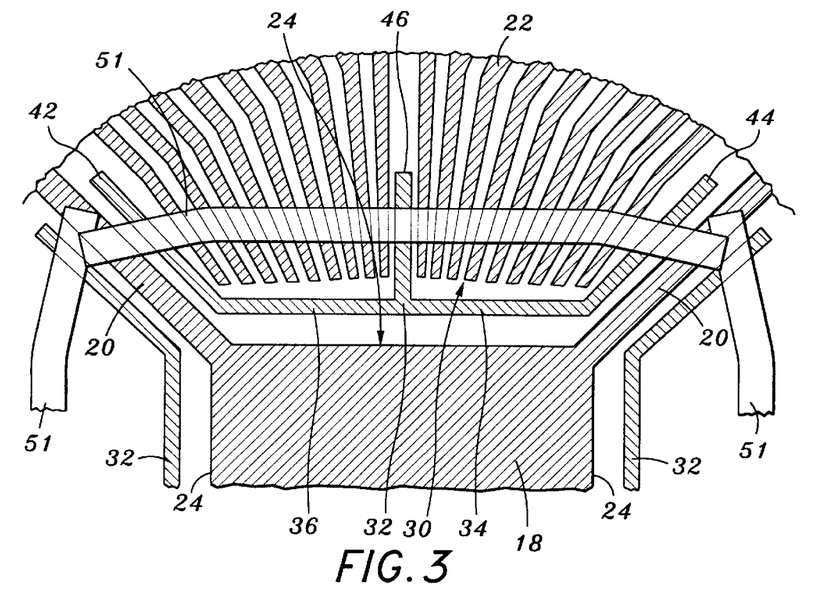
FIG. 3 is the region of the lead frame as shown in FIG. 2 with the ring structure formed from the lead frame with the removal of connecting bars, a nonconductive connector attached to the stub portion of the ring structure and leads, and a semiconductor chip.

Having thus initially provided the above described lead frame 10, the method of fabrication further provides for attachment of a nonconductive connector 51 as shown in FIG. 3. The nonconductive connector 51 is attached to the stub portions 42, 44, 46 and the leads 22 for maintaining the ring structure 32 in fixed relationship to the chip mounting pad 18 and the leads 22. For additional support, the nonconductive connector 51 may be further attached to the tie bars 20. The nonconductive connector 51 may be adhesive tape, such as a conventional polyimide-based tape. Dedicated equipment may be utilized which punches out a piece of tape from a reel in the desired pattern using a custom tape punch tool. The nonconductive connector 51 is then placed upon the lead frame 10, and in particular across the stub portions 42, 44, 46, using an automated pick and place apparatus.

The method further provides for removing the temporary connecting bars 48, 50. Having removed the temporary connecting bars 48, 50, the ring structure 32 is contemplated to be electrically isolated from the chip mounting pad 18, the leads 22, the tie bars 20, and any other portion of the frame 14. The removal of the temporary connecting bars 48, 50 may be accomplished via a punch process wherein a standard punch and die set are configured to remove each of the connecting bars 48, 50. The nonconductive connector 51 is sized and configured to provided sufficient stabilization to maintain the ring structure 32 in a fixed relationship with the chip mounting pad 18 and the leads 22 during this removal process of the temporary connecting bars 48, 50.

Figure 4:
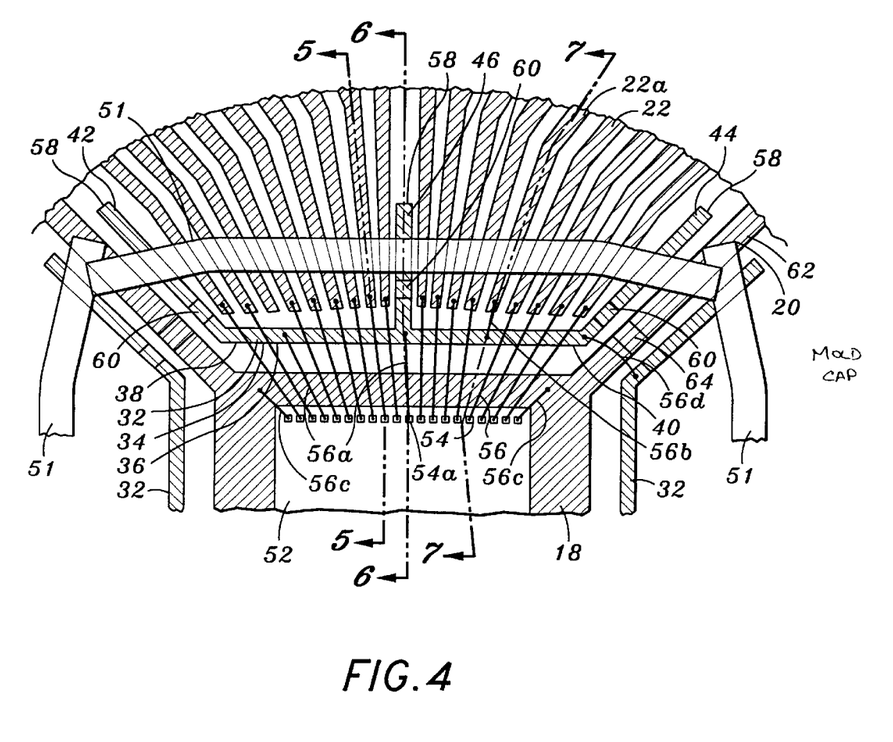
FIG. 4 is the region of the lead frame as shown in FIG. 3 with electrical connections among the semiconductor chip, the ring structure, and the leads.

Referring now to FIG. 4, portions of the frame 12 are downset such as through a die press operation. In particular, the chip mounting pad 18 and the main body portion 34 of the ring structure 32 are formed to be vertically lowered or off-set from those other portions of the frame 12, and most notably the leads 22. Such downsetting results in each of the stub portions 42, 44, 46 of each ring structure 32 including a stub portion distal section 58 which is disposed at the same level as the leads 22 above the corresponding main body portion 34 and chip mounting pad 18. Stub portion transition sections 60 are thus formed between the stub portion distal sections 58 and the main body portion 34 (as additionally depicted in the completed semiconductor package 12 of FIG. 6, as seen along axis 6—6 of FIG. 4). Similarly, the tie bars 20 may include tie bar distal sections 62 and tie bar transition sections 64, the tie bar distal sections 62 and the leads 22 extending in generally coplanar relation to each other. It is contemplated that the degree or level of off-set of the tie bar distal sections 62 and stub portion distal sections 58 relative to the main body portions 34 of the ring structures 32 and chip mounting pad 18 will be substantially equal. The location and placement of the nonconductive connector 51 is such that the nonconductive connector 51 extends across the stub portion distal sections 60, the tie bar distal sections 62, and the leads 22.

Figure 5:
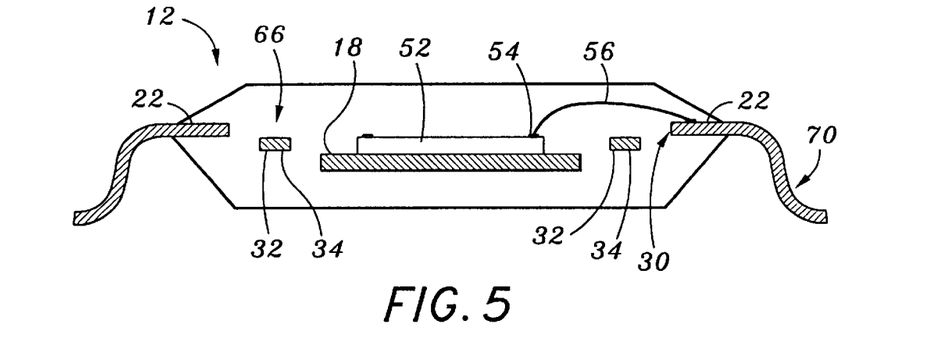
FIG. 5 is a cross sectional view of a completed semiconductor package as seen along axis 5—5 of FIG. 4.
Figure 7:
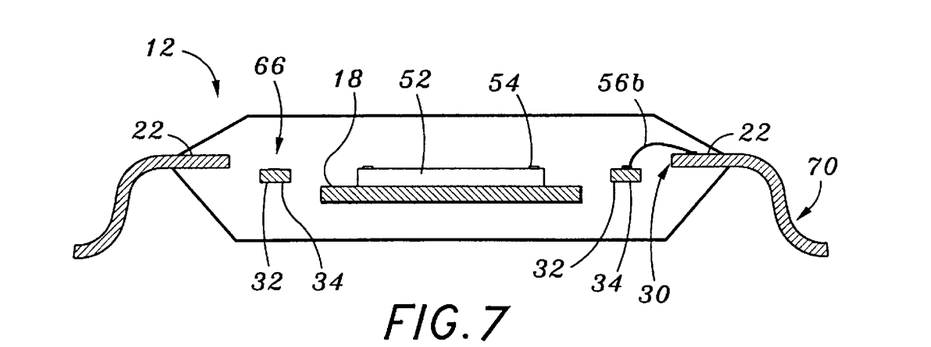
FIG. 7 is a cross sectional view of a completed semiconductor package as seen along axis 7—7 of FIG. 4.

As seen in FIGS. 5–7, the downsetting of the chip mounting pad 18 and main body portions 34 of the ring structures 32 relative to the leads 22 is preferably accomplished in the manner wherein the main body portions 34 of the ring structures 32 are located between the leads 22 and the chip mounting pad 18. However, those of ordinary skill in the art will recognize that the downsetting operation may be completed in a manner wherein only the chip mounting board 18 is downset, with the main body portions 34 of the ring structures 32 each being at the same level as the leads 22. As a further alternative, the downsetting operation may be completed in a manner wherein the main body portions 34 of the ring structures 32 are downset from the leads 22 at the same level as the chip mounting pad 18.

The method next provides for attaching a semiconductor die or chip 52 to the chip mounting pad 18. Such attachment or bonding may be accomplished through the use of an epoxy, an adhesive film, or adhesive tape. The semiconductor chip 52 includes a plurality of input/output pads 54 disposed on an upper surface thereof.

The method further provides for electrically connecting the semiconductor chip 52 to at least one ring structure 32. In this regard, selected ones of the input/output pads 54, such as 54a, are electrically connected to the ring structure 32. In turn, the ring structure 32 is electrically connected to at least one of the leads 22, such as lead 22a. Such electrical connections may be facilitated through the use of conductive wires 56 (exemplary ones depicted). The conductive wires 56 may be formed of gold, copper, or aluminum wires for example. Moreover, common wire bonding techniques may be employed such as Au ball bonding.

Thus, the conductive wires 56a are used to electrically connect the input/output pads 54a to the ring structure 32 (as additionally depicted in the completed semiconductor package 12 of FIG. 6, as seen along axis 6—6 of FIG. 4). Further, the conductive wire 56b is used to electrically connect the ring structure 32 to the lead 22a (as additionally depicted in the completed semiconductor package 12 of FIG. 7, as seen along axis 7—7 of FIG. 4). The forgoing configuration advantageously allows the ring structure 32 to share a common electrical potential as the connected lead 22a. For example, the lead 22a may be utilized for connection to an external power source (not shown). Connection of the lead 22a to the ring structure 32 is achieved through the connecting wire 56b. This in turn results in the entire ring structure 32 being conveniently available for connection by any of the input/output pads 54, such as pads 54a, through the connecting wires 56a. Thus, a single lead (e.g., lead 22a) may be utilized to power both of the input/output pads 54, thereby avoiding one-to-one dedication of leads 22 for each of the input/output pads 54. In an alternate exemplary usage, the lead 22a may be connected to electrical ground, thereby providing the ring structure 32 as a convenient ground source.

In addition, where there are multiple ring structures, such ring structure may be electrically connected via a connecting wire 56d. Advantageously, this allows for multiple ring structures 32 to be electrically charged or grounded while only requiring use or dedication of a single lead. Multiple ring structures 32 allows for the convenience or close proximity to input/output pads 54 of the semiconductor chip 52 requiring connection to a power or grounding source.

Referring additionally to the completed semiconductor package 12 of FIG. 5, as seen along axis 5—5 of FIG. 4, other ones of the input/output pads 54 of the semiconductor chip 52 are directly electrically connected other respective ones of the leads 22 through the connecting wires 56. Thus, the electrical signals of the semiconductor chip 52 can be transmitted to a printed circuit board (not shown) via the conductive wires 56 and the leads 22. The conductive wires 56 and the leads 22 may also be used to facilitate the transmission of electrical signals from the printed circuit board to the semiconductor chip 52.

It is contemplated that a lead frame template design may be configured with one or more of the leads 22 integrally formed with the ring structure 32. However, by mechanically isolating the ring structures 32 from the leads 22 and the chip mounting pad 18 with the removal of the connecting bars 48, 50, electrical connection of the input/output pads 54 to the ring structures 32 and connection of the ring structures 32 to one or more of the leads 22 may be reconfigured or redesigned by controlling the bond wire connection process. This is contemplated to be effectuated through software inputs which control automated wire bond tooling. This allows for a single leads frame template design to be possibly used to with a variety of semiconductor chips 52 having differing electrical requirement for input/output pad locations.

It is contemplated that prescribed portions of the frame 12 are subsequently encapsulated. In this regard, the semiconductor chip 52, the chip mounting pad 18, the conductive wires 56, the tie bars 20, the leads 22, the nonconductive connector 51 and the ring structures 32 are at least partially encapsulated with a sealing material, such as an epoxy molding compound. The area sealed with the sealing material is defined as a package body or sealing part 66.

Finally, the semiconductor package 12 is formed with the completion of a singulation process or step. In this respect, in the lead frame 10, the leads 22 are singulated to separate the semiconductor package 12 from the frame 14. Referring additionally to the completed semiconductor package 12 of FIGS. 5 and 7, as respectively seen along axes 5—5 and 7—7 of FIG. 4, this results in the leads 22 including distal portions 70 which are exposed, i.e., protrude from the sealing part 66. The exposed distal portions 70 of the leads 22 may each be formed to assume a gull-wing configuration as shown in FIGS. 5–7, such that the distal ends of the leads 22 protrude below the bottom surface of the sealing part 66 and may be electrically connected to an underlying substrate such as a printed circuit board. Thus, the completed semiconductor package 12 has the general configuration of a standard gull-wing package (e.g., a TSOP or TQFP package).

Figure 8:
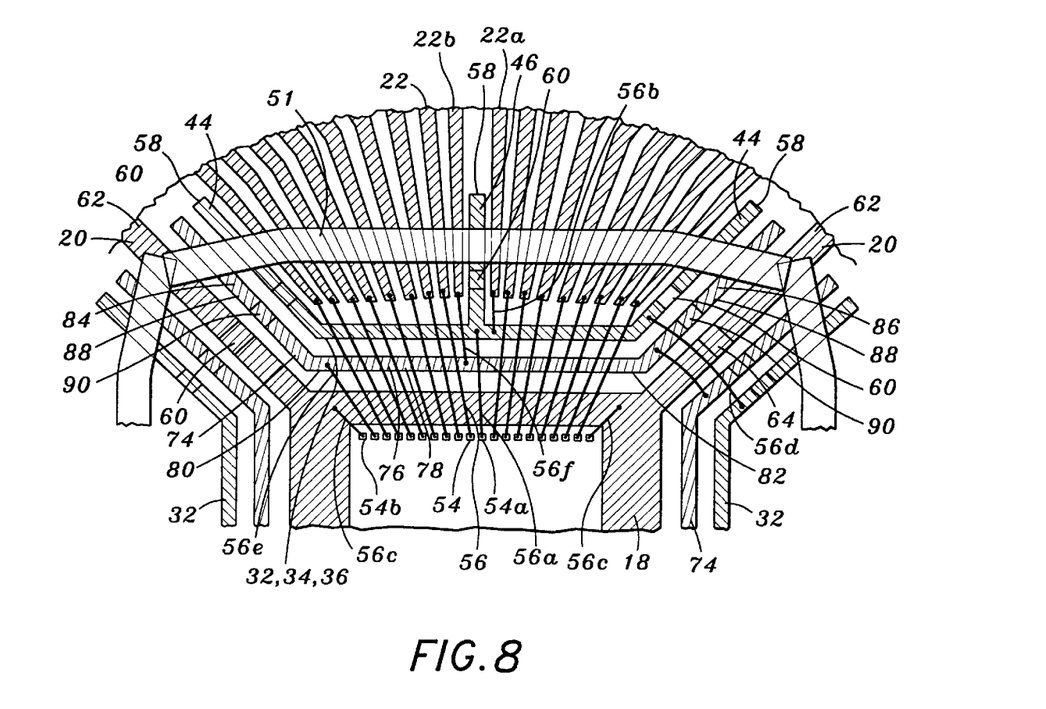
FIG. 8 is a view similar to that of FIG. 4 of a region of a lead frame according to another embodiment of the present invention which includes two ring structures associated with a given peripheral edge segment of a chip mounting pad.

According to another aspect of the present invention, referring now to FIG. 8, there is depicted a region of a lead frame similar in configuration to the lead frame 10 shown in FIG. 4. In this embodiment of the present invention, the lead frame includes a second ring structure 74, and more particularly four second ring structures 74. The second ring structure 74 includes a main body portion 76 which is disposed along a respective peripheral edge segment 24. The main body portion 76 includes an intermediate section 78 which is bounded by opposing end sections 80, 82. The main body portion 34 is disposed between the ring structure 34 and the peripheral edge segments 24. The main body portion 76 is disposed in spaced relation to the ring structure 34 and the peripheral edge segments 24. It is understood that temporary connecting bars (not shown) which are similar to temporary connecting bars 48, 50 may be initially provided to maintain the relative positioning of the second ring structure 74 during initial downsetting operations as discussed above.

The second ring structure 74 further includes at least one stub portion, such as fourth and fifth stub portions 84, 86. Additional or fewer stub portions may be included. The fourth and fifth stub portions 84, 86 extend outwardly from respective ones of the end sections 80, 82. The fourth and fifth stub portions 80, 82 may angularly extend from the main body portion 76. Each of the fourth and fifth stub portions 84, 86 extend between a given tie bar 20 and the adjoining first and second stub portions 42, 44 of the ring structure 34. As a result of the above-described downsetting process, the fourth and fifth stub portions 80, 82 may each include stub portion distal sections 88 and stub portion transition sections 90. As such, the main body portion 76 is vertically downset below the stub portion distal sections 88. The nonconductive connector 51 may be commonly applied across the tie bar distal sections 62, the stub portion distal sections 58, 88 and the leads 22 which are commonly downset to be co-planar.

The semiconductor chip 52 is electrically connected to the second ring structure 74 via conductive wires 56. In this regard, selected ones of the input/output pads 54, such as 54b, are electrically connected to the ring structure 74 via a conductive wire 56e. In turn, the ring structure 74 is electrically connected to at least one of the leads 22, such as lead 22b via conductive wire 56f. As with the ring structure 32, the forgoing configuration advantageously allows the ring structure 74 to share a common electrical potential as the connected lead, such as lead 22b. For example, the lead 22b may be utilized for connection to an external power source (not shown). Such a power source may be at a different voltage that a power source electrically connected to the ring structure 32. Connection of the lead 22b to the second ring structure 74 is achieved through the connecting wire 56f. This in turn results in the entire second ring structure 74 being conveniently available for connection by any of the input/output pads 54, such as pad 54b, through the connecting wire 56e. In addition, multiple adjacent second ring structures 74 may be provided and electrically connected via a conductive wire 56d. Thus, a single lead, lead 22b, may be utilized to power multiple second ring structures 74 and any attached input/output pads 54, such as 54e, thereby avoiding one-to-one dedication of leads 22 for each of the input/output pads 54. In an alternate exemplary usage, the lead 22b may be connected to electrical ground, thereby providing the second ring structure 74 as a convenient ground source.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a chip mounting pad having a peripheral edge;
    a semiconductor chip attached to the chip mounting pad;
    a plurality of leads, each lead having an inner end disposed adjacent the peripheral edge in spaced relation thereto and an opposing distal end;
    at least one isolated ring structure electrically connected to the semiconductor chip and at least one of the leads and including:
        a main body portion disposed along the peripheral edge between the peripheral edge and the inner ends of the leads in spaced relation thereto; and
        at least one stub portion extending from the main body portion and along one of the leads in spaced relation thereto;
    a connector attached to the leads and to the stub portion for maintaining the ring structure in fixed relation to the chip mounting pad and the leads; and
    a package body at least partially encapsulating the chip mounting pad, the leads, the ring structure, and the connector.

2. The semiconductor package of claim 1 wherein:
    the main body portion includes an intermediate section; and the stub portion extends laterally from the intermediate section.

3. The semiconductor package of claim 2 wherein the stub portion extends along and between a pair of the leads.

4. The semiconductor package of claim 1 wherein:
the main body portion includes opposing end sections; and
the stub portion extends from one of the end sections.

5. The semiconductor package of claim 4 wherein:
the at least one stub portion comprises first and second stub portions; and
the first and second stub portions extend from respective ones of the end sections.

6. The semiconductor package of claim 5 wherein:
the main body portion includes an intermediate section; and
the at least one stub portion further comprises a third stub portion extending laterally from the intermediate section.

7. The semiconductor package of claim 1 further comprising:
at least one tie bar extending from the chip mounting pad;
the stub portion extending along and between the tie bar and one of the leads, with the connector being attached to the tie bar.

8. The semiconductor package of claim 1 wherein:
the chip mounting pad includes a plurality of peripheral edge segments collectively defining the peripheral edge; and
the at least one isolated ring structure comprises a plurality of ring structures disposed adjacent respective ones of the peripheral edge segments.

9. The semiconductor package of claim 1 wherein the at least one isolated ring structure comprises at least two ring structures electrically connected to each other.

10. The semiconductor package of claim 1 wherein:
the ring structure is electrically connected to the semiconductor chip and at least one of the leads via conductive wires; and
the conductive wires are at least partially encapsulated by the package body.

11. The semiconductor package of claim 1 wherein the at least one isolated ring structure comprises a plurality of ring structures disposed adjacent the peripheral edge.

12. The semiconductor package of claim 1 wherein:
the at least one stub portion includes a distal section which extends in generally coplanar relation to the leads; and
the main body portion and the chip mounting pad are downset relative to the distal section and the leads.

13. A method of fabricating a semiconductor package, comprising the steps of:
a) providing a lead frame including:
a chip mounting pad having a peripheral edge;
a plurality of leads, each lead having an inner end disposed adjacent the peripheral edge in spaced relation thereto and an opposing distal end;
at least one isolated ring structure including a main body portion disposed along the peripheral edge between the peripheral edge and the inner ends of the leads in spaced relation thereto, and at least one stub portion extending angularly from the main body portion and along one of the leads in spaced relation thereto; and
at least one temporary connecting bar connecting the ring structure to the chip mounting pad and the leads;

b) attaching a nonconductive connector to the stub portion and at least one of the leads for maintaining the ring structure in fixed relationship to the chip mounting pad and the leads;
c) removing the temporary connecting bar;
d) attaching a semiconductor chip to the chip mounting pad;
e) electrically connecting the semiconductor chip to the ring structure; and
f) electrically connecting the ring structure to at least one of the leads.

14. The method of claim 13 further comprising the step of:
(g) at least partially encapsulating the chip mounting pad, the leads, the ring structure, and the connector with a package body.

15. The method of claim 13 wherein step (a) comprises forming the lead frame such that the temporary connecting bar extends between the ring structure and the chip mounting pad.

16. The method of claim 13 wherein step (a) comprises forming the lead frame such that the temporary connecting bar extends between the ring structure and at least one of the leads.

17. The method of claim 13 wherein step (b) comprises attaching adhesive tape to the stub portion and at least one of the leads.

18. The method of claim 13 wherein step (b) comprises attaching the nonconductive connector via a pick and place apparatus.

19. The method of claim 13 wherein step c) comprises removing the temporary connecting bar via a punch process.

20. The method of claim 13 wherein:
step (a) comprises forming the lead frame such that at least one tie bar extends from the chip mounting pad, and the at least one stub portion extends along and between the tie bar and one of the leads; and
step b) comprises attaching the nonconductive connector to the tie bar.

21. The method of claim 14 wherein:
steps (e) and (f) are accomplished through the use of conductive wires; and
step (g) comprises encapsulating the conductive wires with the package body.

22. The method of claim 13 wherein:
step (a) comprises forming the lead frame such that the at least one isolated ring structure comprises at least two ring structures; and
step f) comprises electrically connecting the at least two ring structures to each other.

23. The method of claim 13 wherein:
step (a) comprises forming the lead frame such that the stub portion includes a distal section which extends in generally coplanar relation to the leads; and
the method further comprises the step (g) of downsetting the main body portion and the chip mounting pad relative to the distal section and the leads.

24. A lead frame comprising:
a frame defining a central opening;
a chip mounting pad disposed within the central opening and attached to the frame;
a plurality of leads attached to the frame and extending within the opening toward the chip mounting pad, each of the leads having an inner end disposed in spaced relation to the peripheral edge of the chip mounting pad;

at least one isolated ring structure comprising:
- a main body portion extending between the peripheral edge and the inner ends of the leads in spaced relation thereto; and
- at least one stub portion extending from the main body portion along one of the leads in spaced relation thereto; and at least one temporary connecting bar connecting the ring structure to at least one of the chip mounting pad and the leads.

25. The lead frame of claim 24 wherein:
the main body includes an intermediate section; and
the stub portion extends laterally from the intermediate section.

26. The lead frame of claim 24 wherein the stub portion extends along and between a pair of leads.

27. The lead frame of claim 24 wherein:
the main body includes opposed end sections; and
the stub portion extends from one of the end sections.

28. The lead frame of claim 27 wherein:
the at least one stub portion comprises first and second stub portions; and
the first and second stub portions extend angularly from respective ones of the end sections.

29. The lead frame of claim 28 wherein:
the main body includes an intermediate section; and
the at least one stub portion further comprises a third stub portion extending laterally from the intermediate section.

30. The lead frame of claim 24 wherein the at least one isolated ring structure comprises a pair of ring structures extending between the chip mounting pad and the inner ends of the leads in spaced relation to each other.

31. The semiconductor package of claim 1 wherein the connector comprises non-conductive adhesive tape.

32. A semiconductor package comprising:
a chip mounting pad having a peripheral edge;
a semiconductor chip attached to the chip mounting pad;
a plurality of leads, each lead having an inner end disposed adjacent the peripheral edge in spaced relation thereto and an opposing distal end;
at least one isolated ring structure electrically connected to the semiconductor chip and at least one of the leads and including:
- a main body disposed along the peripheral edge between the peripheral edge and the inner ends of the leads in spaced relation thereto; and
- at least one stub portion extending from the main body portion and along one of the leads in spaced relation thereto;

connector means attached to the leads and to the stub portion for maintaining the ring structure in fixed relation to the chip mounting pad and the leads; and
a package body at least partially encapsulating the chip mounting pad, the leads, the ring structure, and the connector.

* * * * *